United States Patent
Tsai et al.

(10) Patent No.: US 9,461,001 B1
(45) Date of Patent: Oct. 4, 2016

(54) SEMICONDUCTOR DEVICE PACKAGE INTEGRATED WITH COIL FOR WIRELESS CHARGING AND ELECTROMAGNETIC INTERFERENCE SHIELDING, AND METHOD OF MANUFACTURING THE SAME

(71) Applicant: Advanced Semiconductor Engineering, Inc., Kaohsiung (TW)

(72) Inventors: Ming-Horng Tsai, Kaohsiung (TW); Wei-Yu Chen, Kaohsiung (TW); Chun-Chia Lee, Kaohsiung (TW); Huan Wun Li, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/805,847

(22) Filed: Jul. 22, 2015

(51) Int. Cl.
| | |
|---|---|
| H01L 23/552 | (2006.01) |
| H01L 23/31 | (2006.01) |
| H01L 23/538 | (2006.01) |
| H01L 21/52 | (2006.01) |
| H01L 21/26 | (2006.01) |
| H01L 21/768 | (2006.01) |
| H01L 23/04 | (2006.01) |
| H01L 23/64 | (2006.01) |
| H01L 21/48 | (2006.01) |
| H01L 21/56 | (2006.01) |
| H02J 7/02 | (2016.01) |

(52) U.S. Cl.
CPC ......... *H01L 23/552* (2013.01); *H01L 21/4817* (2013.01); *H01L 21/52* (2013.01); *H01L 21/56* (2013.01); *H01L 21/76892* (2013.01); *H01L 23/04* (2013.01); *H01L 23/3107* (2013.01); *H01L 23/5386* (2013.01); *H01L 23/645* (2013.01); *H02J 7/025* (2013.01)

(58) Field of Classification Search
CPC . H01L 23/04; H01L 23/552; H01L 23/3107; H01L 21/52; H01L 21/56; H01L 21/76892
See application file for complete search history.

(56) References Cited

U.S. PATENT DOCUMENTS

| | | | |
|---|---|---|---|
| 5,639,989 A | 6/1997 | Higgins, III | |
| 8,058,714 B2 * | 11/2011 | Noll | H01Q 1/40 257/678 |
| 8,399,964 B2 * | 3/2013 | Katti | H01L 23/552 257/422 |
| 8,786,060 B2 | 7/2014 | Yen et al. | |
| 9,153,543 B1 * | 10/2015 | Mangrum | H01L 23/60 |
| 2004/0217472 A1 * | 11/2004 | Aisenbrey | H01L 23/49855 257/734 |
| 2014/0140001 A1 * | 5/2014 | Gerken | H05K 9/0041 361/690 |
| 2014/0231973 A1 * | 8/2014 | Huang | H01L 23/49894 257/659 |

* cited by examiner

*Primary Examiner* — Mohsen Ahmadi
(74) *Attorney, Agent, or Firm* — Foley & Lardner LLP; Cliff Z. Liu; Angela D. Murch

(57) ABSTRACT

The present disclosure relates to a semiconductor device package which includes a carrier, an electronic component, conductive elements, a package body, a shield, a magnetic insulating layer, and a patterned conductive layer. The carrier has a top surface on which the electronic component is disposed. The conductive elements are disposed on the top surface of the carrier. The package body is disposed on the top surface of the carrier and encapsulates the electronic component and a portion of each of the conductive elements. The shield is disposed on the package body and covers an exterior of the package body. The magnetic insulating layer is disposed on a top surface of the shield. The patterned conductive layer is disposed on the magnetic insulating layer. Each of the conductive elements electrically connects the patterned conductive layer to the electronic component.

8 Claims, 6 Drawing Sheets

SEMICONDUCTOR DEVICE PACKAGE INTEGRATED WITH COIL FOR WIRELESS CHARGING AND ELECTROMAGNETIC INTERFERENCE SHIELDING, AND METHOD OF MANUFACTURING THE SAME

BACKGROUND

1. Technical Field

The present disclosure relates generally to semiconductor device packages and the manufacturing methods thereof. More particularly, the present disclosure relates to semiconductor device packages integrated with coils for wireless charging and integrated with shields for electromagnetic interference shielding, and the manufacturing methods thereof.

2. Description of the Related Art

Semiconductor devices have become progressively more complex, driven at least in part by the demand for enhanced processing speeds and smaller sizes. While the benefits of enhanced processing speeds and smaller sizes are apparent, these characteristics of semiconductor devices also can create problems. In particular, higher clock speeds can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of that semiconductor device. This phenomenon is sometimes referred to as electromagnetic interference (EMI). Smaller sized semiconductor devices can exacerbate EMI by providing a higher density of those semiconductor devices within an overall electronic system, and, thus, a higher level of undesired electromagnetic emissions at a neighboring semiconductor device.

One way to reduce EMI is to shield a set of semiconductor devices within a semiconductor device package by a metal casing or housing. In particular, shielding can be accomplished by including an electrically conductive casing or housing that is electrically grounded and is secured to an exterior of the package. When electromagnetic emissions from an interior of the package strike an inner surface of the casing, at least a portion of these emissions can be electrically shorted, thereby reducing the level of emissions that can pass through the casing and adversely affect neighboring semiconductor devices. Similarly, when electromagnetic emissions from a neighboring semiconductor device strike an outer surface of the casing, a similar electrical shorting can occur to reduce EMI of semiconductor devices within the package. However, such metal casing or housing may not block electromagnetic emissions of relatively low frequency (e.g., under 1 GHz). Further, such metal casing or housing can add to manufacturing and product costs.

It is against this background that a need arose to develop the semiconductor device packages and related methods described herein.

SUMMARY

In accordance with an embodiment of the present disclosure, a semiconductor device package includes: a carrier, an electronic component, conductive elements, a package body, a shield, a magnetic insulating layer, and a patterned conductive layer. The electronic component is disposed on a top surface of the carrier. The conductive elements are disposed on the top surface of the carrier. The package body is disposed on the top surface of the carrier and encapsulates the electronic component and a portion of each of the conductive elements. The shield is disposed on the package body and covers an exterior of the package body. The magnetic insulating layer is disposed on a top surface of the shield. The patterned conductive layer is disposed on the magnetic insulating layer. Each of the conductive elements electrically connects the patterned conductive layer to the electronic component.

In accordance with an embodiment of the present disclosure, a wirelessly-charged device includes a substrate, a die, a package body, an EMI shield, a magnetic insulating layer, a receiver and conductive elements. The die is disposed on the substrate. The package body is disposed on the substrate and encapsulates the die. The EMI shield covers an exterior of the package body. The magnetic insulating layer is disposed on a portion of the EMI shield. The receiver is disposed on the magnetic insulating layer. The conductive elements penetrate the shield and the package body and electrically connect the receiver to the die.

In accordance with an embodiment of the present disclosure, a method of manufacturing a semiconductor device package includes: (a) providing a carrier; (b) attaching an electronic component on the carrier; (c) forming a first conductive element and a second conductive element on the carrier, where each of the first conductive element and the second conductive element electrically connects to the electronic component; (d) forming a package body on the carrier to encapsulate the electronic component, the first conductive element and the second conductive element; (e) forming a shield covering an exterior of the package body; (f) forming a magnetic insulating layer on a portion of an exterior of the shield; (g) removing a portion of the package body and the shield to expose the first conductive element and the second conductive element; (h) forming a patterned conductive layer including a first terminal and a second terminal above the shield, wherein the patterned conductive layer is formed on the magnetic insulating layer; and (i) electrically connecting the exposed first conductive element to the first terminal and electrically connecting the exposed second conductive element to the second terminal.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
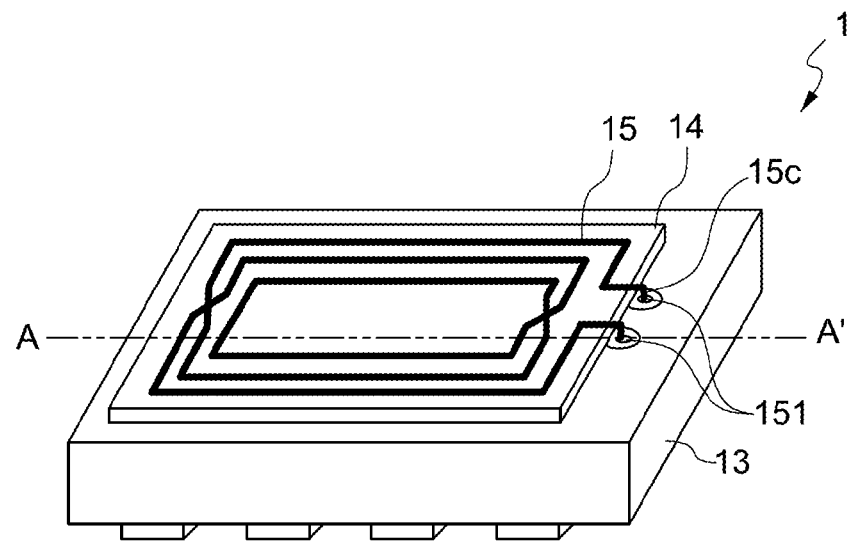
FIG. 1A illustrates a top view of a semiconductor device package in accordance with an embodiment of the present disclosure.

FIG. 1A illustrates a top view of a semiconductor device package 1 in accordance with an embodiment of the present disclosure. The semiconductor device package 1 includes an EMI shield 13 covering a substrate and electronic components (not shown), a magnetic insulating layer 14 and a patterned conductive layer 15.

The patterned conductive layer 15 includes at least two terminals 151, each of which electrically connects to a respective conductive element 15c. The patterned conductive layer 15 can be magnetically coupled to an external magnetic field, which induces a current in the conductive layer 15. An induced current can be transmitted to one or more electronic components covered by the EMI shield 13 through the conductive elements 15c. The patterned conductive layer 15 can be patterned in a shape suitable for a desired coupling to the external magnetic field. In one or more embodiments, the patterned conductive layer 15 is in a pattern of multiple concentric and overlapping rectangles, as illustrated in FIG. 1A; however other patterns can be used instead, such as a single rectangle, one or more squares, one or more circles, one or more octagons or other polygonal form, or combinations thereof.

Figure 1B:
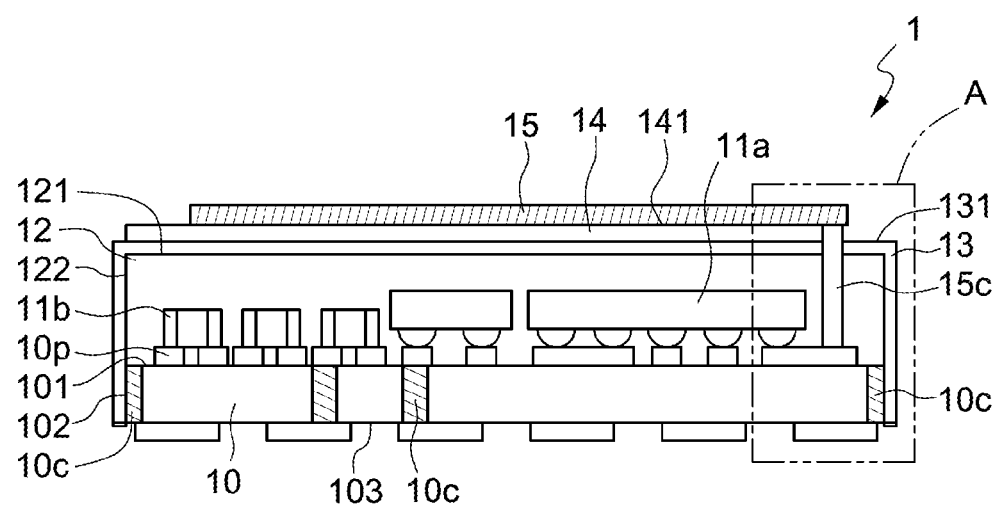
FIG. 1B illustrates a cross-sectional view of a semiconductor device package in accordance with an embodiment of the present disclosure.

FIG. 1B illustrates a cross-sectional view of the semiconductor device package 1 in accordance with an embodiment of the present disclosure. The cross-sectional view of FIG. 1B is along a plane including the line A-A' of FIG. 1A, where the line A-A' extends across a top surface of the EMI shield 13, and the plane is perpendicular to the top surface of the EMI shield 13. The semiconductor device package 1 includes a substrate 10, electronic components 11a and 11b, a package body 12, the EMI shield 13, the magnetic insulating layer 14, the patterned conductive layer 15 and conductive elements 15c.

The substrate 10 is formed of, for example, a printed circuit board, such as a paper-based copper foil laminate, a composite copper foil laminate, or a polymer-impregnated glass-fiber-based copper foil laminate. The substrate 10 may include a redistribution layer (RDL) or traces; for example, for electrical connection between components (e.g., the electronic components 11a, 11b) mounted on a top surface 101 of the substrate 10. In one or more embodiments, the electronic components 11a, 11b are disposed on pads 10p on the substrate 10. The substrate 10 may include through vias penetrating the substrate 10, within which are disposed electrical connections 10c extending between the top surface 101 and a bottom surface 103 of the substrate 10. The substrate 10 can be replaced by other suitable carriers, such as a leadframe.

The electronic component 11a is disposed on the top surface 101 of the substrate 10. In one or more embodiments, the electronic component 11a is an active component, such as a chip or a semiconductor die. The electronic component 11a can be electrically connected to the substrate 10 by flip chip bonding, wire-bonding, copper pillar bonding, or a combination thereof.

The electronic component 11b is disposed on the top surface 101 of the substrate 10. In one or more embodiments, the electronic component 11b is a passive component, for example, a resistor, a capacitor, an inductor, a filter, a diplexer, a balun, or a combination of such components.

The conductive elements 15c are disposed on the top surface of the substrate 10. Each conductive element 15c electrically connects an electronic component (e.g., electronic component 11a) with the patterned conductive layer 15.

The package body 12 is disposed on the top surface 101 of the substrate 10 to encapsulate the electronic components 11a, 11b and a portion of each conductive element 15c. The package body 12 includes a top surface 121 and a lateral surface or surfaces 122. The package body 12 can be, or can include, for example, an epoxy resin having fillers, a molding compound (e.g., an epoxy molding compound or other molding compound), a polyimide, a phenolic compound or material, a material with a silicone dispersed therein, or a combination thereof.

The EMI shield 13 is disposed on the package body 12 and covers the top surface 121 and the lateral surface(s) 122 of the package body 12, and further covers a lateral surface or surfaces 102 of the substrate 10. The EMI shield 13 contacts, and is grounded by, the electrical connections 10c. In one or more embodiments, an electrical connection 10c contacts a ground pad at a periphery of the substrate 10, and the EMI shield 13 is grounded through the electrical connection 10c to the ground pad.

The magnetic insulating layer 14 is disposed on a top surface 131 of the EMI shield 13. In one or more embodiments, the magnetic insulating layer 14 includes an insulating material, such that a permeability of the magnetic insulating 14 is greater than about 50 Henries per meter (H/m). In one or more embodiments, the magnetic insulating layer 14 includes a ferromagnetic material, such as iron oxide or other ferromagnetic metal oxides.

The patterned conductive layer 15 is disposed on a top surface 141 of the magnetic insulating layer 14. The patterned conductive layer 15 is, or includes, a conductive material such as a metal or metal alloy. Examples include gold (Au), silver (Ag), aluminum (Al), copper (Cu), or an alloy thereof. The patterned conductive layer 15 can be magnetically coupled to a magnetic field to induce a current within the patterned conductive layer 15. As such, the patterned conductive layer 15 can operate as a coil, and in one or more embodiments is a coil attached to the magnetic insulating layer 14. In one or more embodiments, the induced current is provided to the electronic component 11a through the conductive elements 15c.

In one or more embodiments, the induced current is additionally or alternatively provided to a component or device external to semiconductor device package 1 by way of the conductive elements 15c, traces in or on the substrate 10, and the electrical connections 10c. For example, an external capacitor electrically coupled to a conductive element 15c can be used to receive the induced current and to store electric energy of the induced current, and to subsequently provide the stored electric energy to a power distribution circuit including the electronic component 11a. Thus, in one or more embodiments, the patterned conductive layer 15 performs as a wireless receiver (e.g., a charging coil) for energy transfer to a power distribution circuit internal to the semiconductor device package 1 (with energy storage internal or external to the semiconductor device package 1). Including a wireless charging coil on the semiconductor device package 1 reduces size and manufacturing costs for an electronic device including the semiconductor device package 1, as compared to a semiconductor device package 1 receiving power from a power supply external to the device.

Figure 2A:
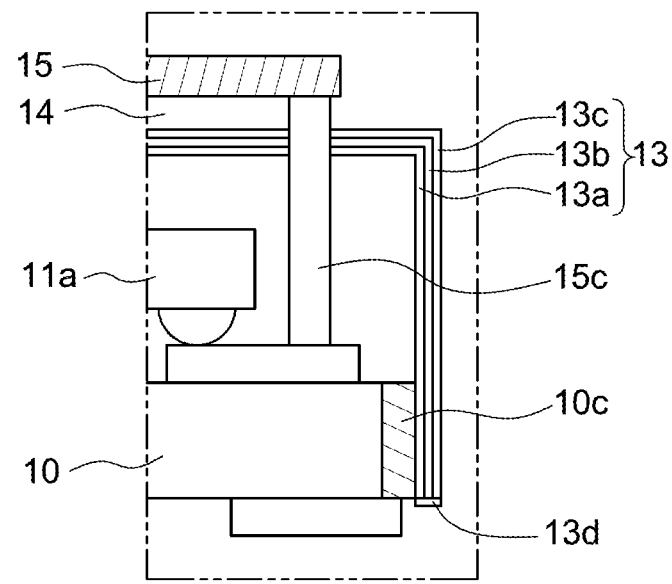
FIG. 2A illustrates an enlarged view of the semiconductor device package of FIG. 1B in accordance with an embodiment of the present disclosure.

FIG. 2A illustrates an enlarged view of an area 'A' denoted by dotted line in FIG. 1B, in accordance with an embodiment of the present disclosure. The EMI shield 13 in this embodiment includes a non-magnetic (or weakly magnetic) conductive layer 13a, an insulating layer 13b, and a magnetic conductive layer 13c. The insulating layer 13b is located between the non-magnetic conductive layer 13a and the magnetic conductive layer 13c. An interconnection 13d is used to electrically connect the non-magnetic conductive layer 13a and the magnetic conductive layer 13c.

The non-magnetic conductive layer 13a is, or includes, a material with a high conductivity. For example, the non-magnetic conductive layer 13a is Ag, Cu, Al, Au, or an alloy thereof. The insulating layer 13b is insulating, and can be magnetic or non-magnetic. The insulating layer 13b can be, or can include, for example, ferromagnetic materials such as barium ferrate or strontium ferrite. The insulating layer 13b can be, or can include, an oxidized form of metals or non-metals such as silicon dioxide ($SiO_2$) or aluminum oxide ($Al_2O_3$). The magnetic conductive layer 13c can be, or can include, for example, molybdenum (Mo), nickel (Ni), cobalt (Co), iron (Fe), or an alloy thereof.

The non-magnetic conductive layer 13a can be used to resist high frequency (e.g., greater than about 1 GHz) electromagnetic radiation. The resistance to high frequency electromagnetic radiation is related to mechanisms of absorption and reflection within the non-magnetic conductive layer 13a. The effectiveness of absorption is directly proportional to the product $(\sigma r)\cdot(\mu r)$, where $(\sigma r)$ is the electrical conductivity relative to copper and $(\mu r)$ is the magnetic permeability relative to copper. The effectiveness of reflection is directly proportional to the ratio $(\sigma r)/(\mu r)$.

The non-magnetic conductive layer 13a and the insulating layer 13b can be used to resist low frequency (e.g., less than about 1 GHz) electromagnetic radiation. Resistance to low frequency electromagnetic radiation is related to mechanisms of absorption within the non-magnetic conductive layer 13a, as well as a magnetic field induced by eddy currents within the EMI shield 13. The effectiveness of absorption is directly proportional to the product $(\sigma r)\cdot(\mu r)$. An external magnetic field induces eddy currents, which can generate a reverse magnetic field to resist low frequency external electromagnetic radiation. For example, by inserting the insulating layer 13b between the non-magnetic conductive layer 13a and the magnetic conductive layer 13c, two eddy currents will be generated; one at an interface of the non-magnetic conductive layer 13a and the insulating layer 13b, and one at an interface of the magnetic conductive layer 13c and the insulating layer 13b.

Therefore, the EMI shield 13 illustrated in FIG. 2A provides for improved electromagnetic shielding against both higher frequency electromagnetic radiation and lower frequency electromagnetic radiation, in comparison with a conventional EMI shield with single layer of thickness approximately equal to a thickness of the EMI shield 13 of FIG. 2A.

In one or more embodiments, the EMI shield 13 can include additional conductive layers with insulating layers interposed between, providing additional interfaces with eddy currents, so that the EMI shield 13 can provide better shielding effectiveness with respect to lower frequency electromagnetic radiation. For example, thinner layers may be used throughout the EMI shield 13, so that additional layers may be included without increasing the total thickness of the EMI shield 13. However, undesired leakage current could thereby occur during application of the layers due to the metal-insulator-metal (MIM) structure, where positive charges are accumulated on exterior conductive layers of the EMI shield 13. Thus, in accordance with the present disclosure, the interconnection 13d is selectively connected to each conductive layer of EMI shield 13 and is further electrically coupled to a ground pad to discharge the positive charges accumulated on exterior conductive layers and reduce or eliminate the leakage current.

Figure 2B:
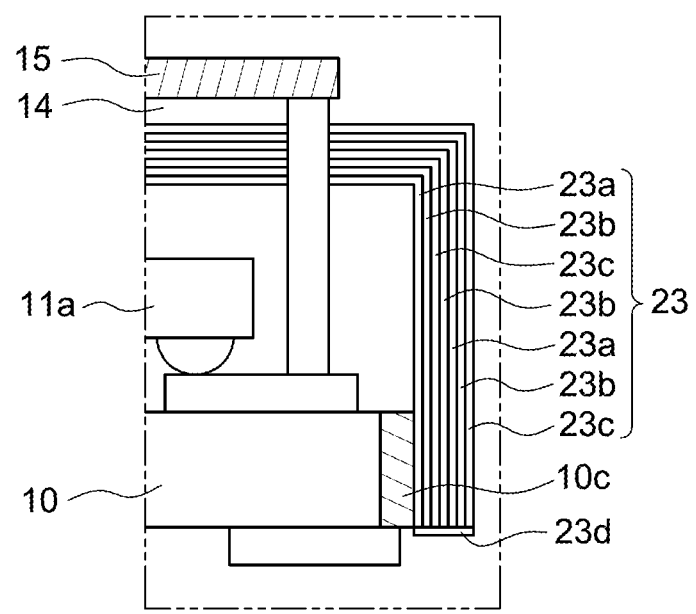
FIG. 2B illustrates an enlarged view of the semiconductor device package of FIG. 1B in accordance with an embodiment of the present disclosure.

FIG. 2B illustrates an enlarged view of the area 'A' denoted by dotted line in FIG. 1B, in accordance with another embodiment of the present disclosure. The EMI shield 13 of FIG. 1B is denoted for the embodiment of FIG. 2B as an EMI shield 23 with two non-magnetic conductive layers 23a, three insulating layers 23b, and two magnetic conductive layers 23c. As shown in FIG. 2B, there is one insulating layer 23b located between each non-magnetic conductive layer 23a and magnetic conductive layer 23c pair. In other words, each non-magnetic conductive layer 23a is separated from a neighboring magnetic conductive layer 23c by an insulating layer 23b, such that each non-magnetic conductive layer 23a is separated from each magnetic conductive layer 23c. In one or more embodiments, multiple insulating layers 23b can be positioned between a non-magnetic conductive layer 23a and a neighboring magnetic conductive layer 23c. An interconnection 23d is used to electrically connect ones of the non-magnetic conductive layers 23a to ones of the magnetic conductive layers 23c.

Because there are more interfaces between conductive layers 23a or 23c and the insulating layers 23b of the EMI shield 23 (e.g., the interfaces of the non-magnetic conductive layer 23a and the insulating layers 23b, or the interfaces of the magnetic conductive layer 23c and the insulating layers 23b) as compared to the EMI shield 13 shown in FIG. 2A, the EMI shield 23 will generate more eddy currents. Correspondingly, a stronger reverse magnetic field will be induced to resist the original magnetic field which resulted in the eddy currents being generated. Therefore, in comparison with the EMI shield 13 shown in FIG. 2A, the EMI shield 23 shown in FIG. 2B provides improved electromagnetic shielding capabilities. The number of non-magnetic conductive layers 23a, insulating layers 23b and magnetic conductive layers 23c can be determined based on design specifications. Note that the EMI shields 13, 23 block magnetic fields generated internally or externally to the semiconductor device package 1.

FIGS. 3A-3D illustrate a semiconductor manufacturing process in accordance with an embodiment of the present disclosure.

Figure 3A:
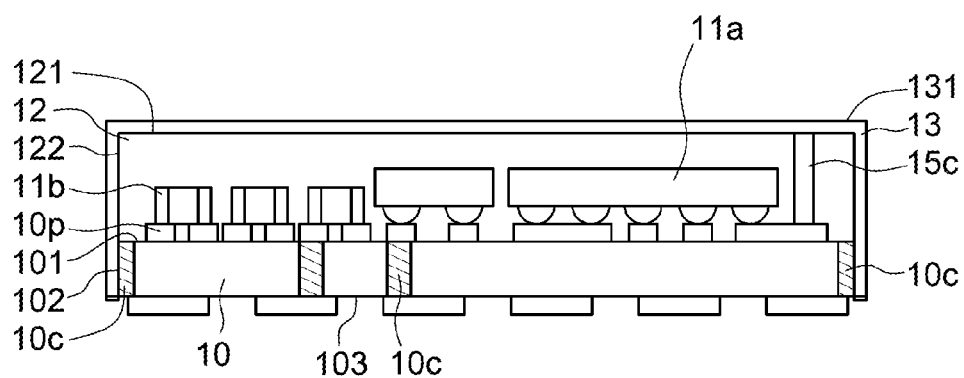
FIG. 3A, FIG. 3B, FIG. 3C, and FIG. 3D illustrate a manufacturing process in accordance with an embodiment of the present disclosure.

Referring to FIG. 3A, a substrate 10 is provided. The substrate 10 is, for example, a printed circuit board, such as a paper-based copper foil laminate, a composite copper foil laminate, or a polymer-impregnated glass-fiber-based copper foil laminate. The substrate 10 can include a redistribution layer (RDL) or traces for electrical connection between components mounted on a top surface 101 of the substrate 10. The substrate 10 includes through vias penetrating the substrate 10, within which are formed electrical connections 10c between the components mounted on the top surface 101 and components mounted on the bottom surface 103 of the substrate 10. The substrate 10 can be replaced by other suitable carriers, such as a leadframe.

Electronic components 11a, 11b and conductive elements 15c are placed on the top surface 101 of the substrate 10. In one or more embodiments, electronic components 11a, 11b can be placed on pads 10p on the top surface 101 of the substrate 10. The conductive elements 15c electrically connect to electronic components such as the electronic component 11a.

A package body 12 is formed to substantially cover or encapsulate the electronic components 11a, 11b and the conductive element 15c. For example, the package body 12 can be formed by applying an encapsulant to the top surface 101 of the substrate 10. In one or more embodiments, the encapsulant can include, for example, a Novolac-based resin, an epoxy-based resin, a silicone-based resin, or another suitable material. In one or more embodiments, the encapsulant can be applied using any of a number of molding techniques, such as compression molding, injection molding, or transfer molding.

An EMI shield 13 is formed to cover a top surface 121 and a lateral surface or surfaces 122 of the package body 12, and to cover a lateral surface or surfaces 102 of the substrate 10. The EMI shield 13 can be formed using any of a number of coating techniques, such as electroless plating, electroplating, printing, spraying, sputtering, or vacuum deposition.

In one or more embodiments, the EMI shield 13 is multi-layered, and includes a non-magnetic conductive layer 13a, an insulating layer 13b and a magnetic conductive layer 13c, such as shown in FIG. 2A. Different layers of the EMI shield 13 can be formed using the same or similar coating technique, or different coating techniques. In one or more embodiments, the EMI shield 13 includes multiple non-magnetic conductive layers 23a, multiple insulating layers 23b and multiple magnetic conductive layers 23c, as shown in FIG. 2B.

Figure 3B:
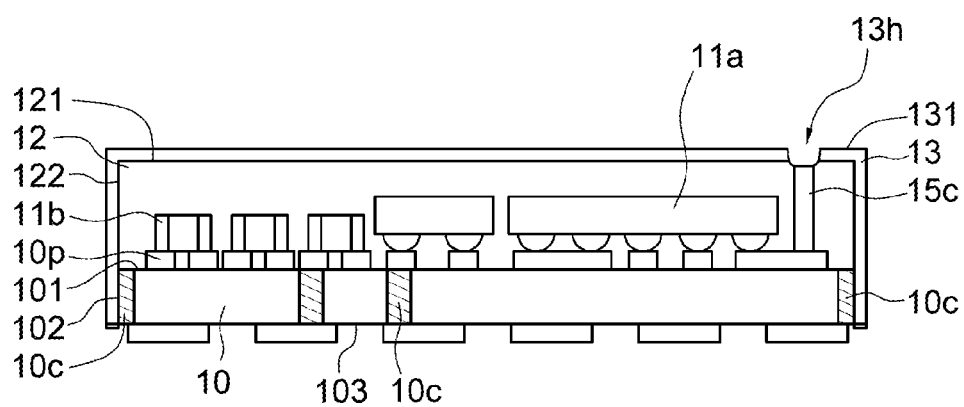

Referring to FIG. 3B, holes 13h are formed through the EMI shield 13 at a top surface 131 of the EMI shield 13, to expose a top portion of the conductive element 15c. The holes 13h can be formed by, for example, laser drilling or etching technology.

Figure 3C:
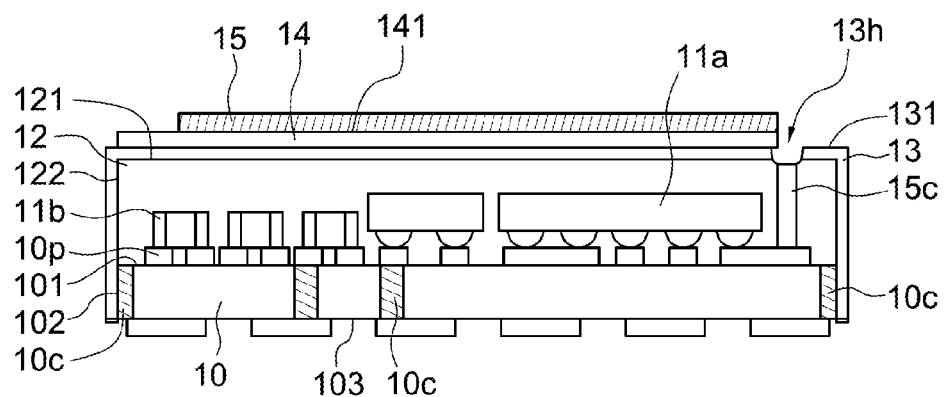

Referring to FIG. 3C, a magnetic insulating layer 14 is formed on the top surface 131 of the EMI shield 13, and a patterned conductive layer 15 is formed on a top surface 141 of the magnetic insulating layer 14. The magnetic insulating layer 14 can be formed by, for example, 3D printing or sputtering. The patterned conductive layer 15 can be formed by, for example, 3D printing, evaporating, sputtering or electroplating. In one or more embodiments, the patterned conductive layer 15 is formed as a coil structure of planar coils with one or more layers of turns. In one or more embodiments, the coil structure is preformed, and attached to the magnetic insulating layer 14.

Figure 3D:
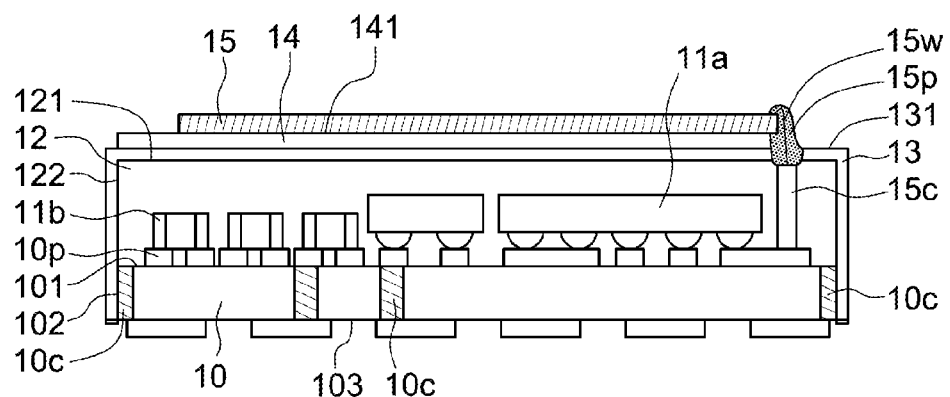

Referring to FIG. 3D, a conductive element 15w is formed to electrically connect the patterned conductive layer 15 to a portion of the conductive element 15c exposed in the hole 13h. In one or more embodiments, the conductive element 15w is a bonding wire. An insulation material 15p is formed to cover and protect the conductive element 15w. In one or more embodiments, the conductive element 15w is a conductive stud or a conductive pillar.

FIGS. 4A-4D illustrate a semiconductor manufacturing process in accordance with an embodiment of the present disclosure.

Figure 4A:
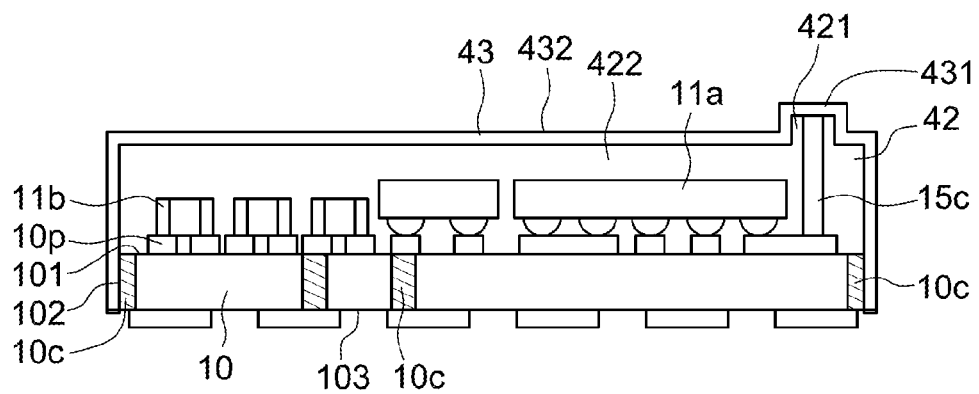
FIG. 4A, FIG. 4B, FIG. 4C, and FIG. 4D illustrate a manufacturing process in accordance with an embodiment of the present disclosure.

The manufacturing operations shown in FIG. 4A are similar to those shown in FIG. 3A, except that in FIG. 4A, a first portion 421 of a package body 42 encapsulating the conductive element 15c is higher than a second portion 422 of the package body 42 encapsulating the electronic components 11a, 11b. The package body 42 can be formed, for example, using an irregular molding process or a selective molding process. An EMI shield 43 is formed on the package body 42, including a first portion 431 over the first portion 421 of the package body 42, and a second portion 432 over the second portion 422 of the package body 42. The EMI shield 43 is further formed on the conductive element 15c.

Figure 4B:
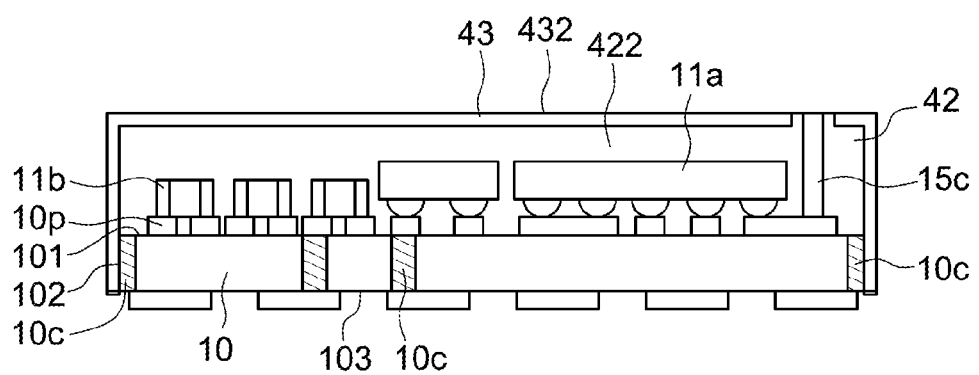

Referring to FIG. 4B, the first portion 421 of the package body 42 and the first portion 431 of the EMI shield 43 are removed to expose a top portion of the conductive element 15c. In one or more embodiments, the exposed portion of the conductive element 15c is substantially coplanar with a top surface of the second portion 432 of the EMI shield 43, as shown in FIG. 4B. (In other embodiments, the exposed portion of the conductive element 15c, along with some of the first portion 431 of the shield 43, extends above the top surface of the second portion 432 of the EMI shield 43.) The first portion 421 of the package body 42 and the first portion 431 of the EMI shield 43 can be removed by, for example, cutting, laser or etching technology.

Figure 4C:
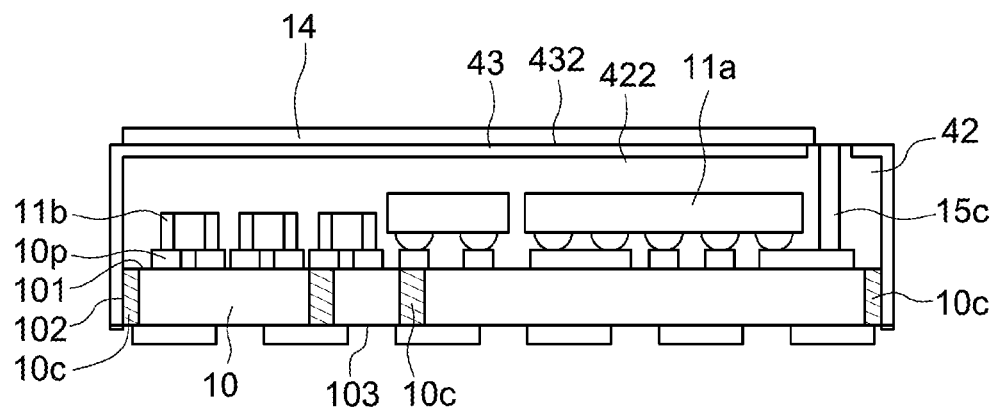

Referring to FIG. 4C, a magnetic insulating layer 14 is formed on the second portion 432 of the EMI shield 43 above the second portion 422 of the package body 42. The magnetic insulating layer 14 can be formed by, for example, 3D printing or sputtering.

Figure 4D:
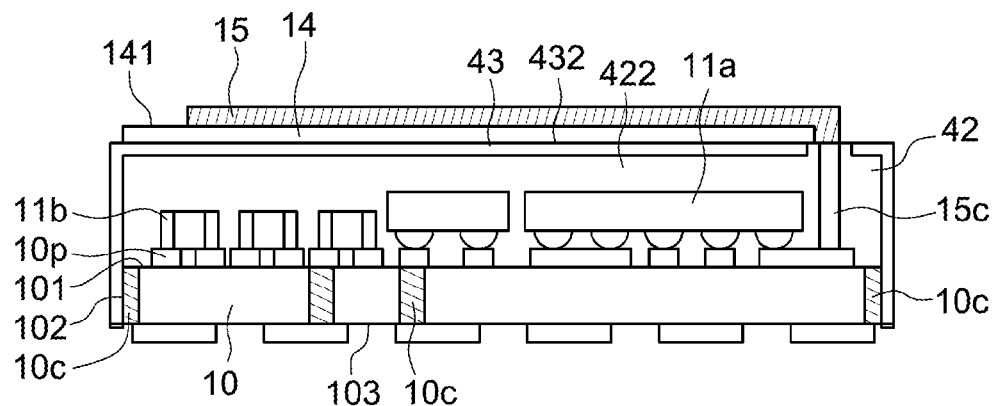

Referring to FIG. 4D, a patterned conductive layer 15 is formed on a top surface 141 of the magnetic insulating layer 14 and contacts the conductive element 15c to form an electrical connection. The patterned conductive layer 15 can be formed by, for example, 3D printing, evaporating, sputtering or electroplating. In one or more embodiments, the patterned conductive layer 15 is formed as a coil structure of planar coils with one or more layers of turns.

In this manner, the patterned conductive layer 15 electrically contacts the exposed portion of the conductive element 15c and is isolated from the EMI shield 43.

As used herein, the terms "substantially" and "about" are used to describe and account for small variations. For example, when used in conjunction with a numerical value, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

For example, two surfaces can be deemed to be coplanar or substantially coplanar if a displacement between the two surfaces is no greater than 5 µm, no greater than 2 µm, no greater than 1 µm, or no greater than 0.5 µm. For another example, a material can be deemed to "substantially cover" a surface if the material covers greater than 95% of the surface; and a material can be deemed to "substantially cover" a component if more than 95% of each surface of the component exposed to the material is covered by the material.

Additionally, amounts, ratios, and other numerical values are sometimes presented herein in a range format. It can be understood that such range formats are used for convenience and brevity, and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising
a carrier having a top surface;
an electronic component disposed on the top surface of the carrier;
at least two conductive elements disposed on the top surface of the carrier;
a package body disposed on the top surface of the carrier and encapsulating the electronic component and a portion of each of the conductive elements;
a shield disposed on the package body and covering an exterior of the package body;
a magnetic insulating layer disposed on a top surface of the shield; and
a patterned conductive layer disposed on the magnetic insulating layer,
wherein each of the conductive elements electrically connects the patterned conductive layer to the electronic component; and
wherein the shield comprises multiple non-magnetic conductive layers, multiple insulating layers and multiple magnetic conductive layers, and wherein at least one of the insulating layers is located between each non-magnetic conductive layer and a neighboring magnetic conductive layer.

2. The semiconductor device package of claim 1, further comprising an interconnection electrically connecting at least one of the non-magnetic conductive layers of the shield to at least one of the magnetic conductive layers of the shield.

3. The semiconductor device package of claim 1, further comprising an interconnection electrically connecting the non-magnetic conductive layers and the magnetic conductive layers.

4. The semiconductor device package of claim 1, further comprising a grounding element disposed at a peripheral edge of the carrier, wherein the shield contacts the grounding element.

5. A semiconductor device package, comprising:
a substrate;
a package body disposed on the substrate;
an electromagnetic interference shield covering top and lateral surfaces of the package body;
a magnetic insulating layer disposed on a top surface of the electromagnetic interference shield, the magnetic insulating layer comprising a ferromagnetic material;
a conductive layer disposed on the magnetic insulating layer, the conductive layer being disposed in a pattern to couple to an external magnetic field, the pattern including multiple overlapping patterns;
conductive elements electrically connecting the conductive layer to the substrate; and
a redistribution layer disposed on the substrate, wherein the conductive elements physically connect the conductive layer to the redistribution layer.

6. The semiconductor package of claim 5, further comprising electrical connections extending between a top surface of the substrate and a bottom surface of the substrate.

7. The semiconductor package of claim 6, wherein at least one of the electrical connections contacts the electromagnetic interference shield.

8. The semiconductor package of claim 5, wherein the multiple overlapping patterns of the conductive layer are multiple concentric and overlapping triangles.

* * * * *